(12) United States Patent
Cheng et al.

(10) Patent No.: US 9,929,256 B2
(45) Date of Patent: Mar. 27, 2018

(54) FABRICATION OF AN ISOLATED DUMMY FIN BETWEEN ACTIVE VERTICAL FINS WITH TIGHT FIN PITCH

(71) Applicant: INTERNATIONAL BUSINESS MACHINES CORPORATION, Armonk, NY (US)

(72) Inventors: Kangguo Cheng, Schenectady, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/474,551

(22) Filed: Mar. 30, 2017

(65) Prior Publication Data

US 2018/0019317 A1    Jan. 18, 2018

Related U.S. Application Data

(62) Division of application No. 15/207,869, filed on Jul. 12, 2016.

(51) Int. Cl.
| | |
|---|---|
| *H01L 27/088* | (2006.01) |
| *H01L 29/66* | (2006.01) |
| *H01L 29/06* | (2006.01) |
| *H01L 29/49* | (2006.01) |
| *H01L 21/02* | (2006.01) |
| *H01L 21/8234* | (2006.01) |

(52) U.S. Cl.
CPC .... *H01L 29/6681* (2013.01); *H01L 21/02236* (2013.01); *H01L 21/823431* (2013.01); *H01L 21/823481* (2013.01); *H01L 27/0886* (2013.01); *H01L 29/0649* (2013.01); *H01L 29/4966* (2013.01)

(58) Field of Classification Search
CPC ................................................... H01L 29/7838
USPC ......................................................... 257/401
See application file for complete search history.

(56) References Cited

U.S. PATENT DOCUMENTS

| | | |
|---|---|---|
| 8,003,466 B2 | 8/2011 | Shi et al. |
| 8,697,515 B2 | 4/2014 | Yin et al. |
| 8,697,523 B2 | 4/2014 | Cai et al. |
| 8,703,557 B1 | 4/2014 | Cai et al. |
| 8,928,083 B2 | 1/2015 | Change et al. |
| 9,087,858 B2 | 7/2015 | Yoo et al. |
| 9,269,589 B2 | 2/2016 | Cheng et al. |
| 2013/0200468 A1 | 8/2013 | Cai et al. |
| 2013/0277760 A1 | 10/2013 | Lu et al. |
| 2015/0255295 A1 | 9/2015 | Jacob et al. |
| 2015/0325482 A1 | 11/2015 | Hu et al. |

OTHER PUBLICATIONS

List of IBM Patents or Patent Applications Treated as Related dated Mar. 30, 2017, 2 pages.

*Primary Examiner* — Anthony Ho
(74) *Attorney, Agent, or Firm* — Tutunjian & Bitetto, P.C.; Vazken Alexanian

(57) ABSTRACT

A method of forming an arrangement of active and inactive fins on a substrate, including forming at least three vertical fins on the substrate, forming a protective liner on at least three of the at least three vertical fins, removing at least a portion of the protective liner on the one of the at least three of the at least three of vertical fins, and converting the one of the at least three of the at least three vertical fins to an inactive vertical fin.

20 Claims, 10 Drawing Sheets

US 9,929,256 B2

FABRICATION OF AN ISOLATED DUMMY FIN BETWEEN ACTIVE VERTICAL FINS WITH TIGHT FIN PITCH

BACKGROUND

Technical Field

The present invention generally relates to formation of inactive dummy fins between active vertical fins, while maintaining a tight fin pitch, and more particularly to inactivating selected vertical fins by conversion to an insulating material (e.g., oxidation) between active fins without increasing fin pitch.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present principles, a method is provided for forming an arrangement of active and inactive fins on a substrate. The method includes the step of forming at least three vertical fins on the substrate. The method further includes the steps of forming a protective liner on at least three of the at least three vertical fins, and removing at least a portion of the protective liner on one of the at least three of the at least three of vertical fins. The method further includes the step of converting the one of the at least three of the at least three vertical fins to an inactive vertical fin.

In accordance with an embodiment of the present principles, a method is provided for forming an arrangement of active and inactive fins on a substrate. The method includes the step of forming at least three vertical fins on the substrate. The method further includes the step of forming a protective liner on at least three of the at least three vertical fins. The method further includes the step of forming a filler layer on the at least three of the at least three vertical fins. The method further includes the step of forming a masking layer on at least a portion of the filler layer, wherein at least a portion of the protective liner on one of the at least three of the at least three vertical fins is exposed. The method further includes the steps of removing at least a portion of the protective liner on the one of the at least three vertical fins, and converting the one of the at least three of the at least three vertical fins to an inactive vertical fin.

In accordance with another embodiment of the present principles, an arrangement of active and inactive fins on a substrate is provided. The arrangement of active and inactive fins includes a plurality of active vertical fins, wherein the active vertical fins are made of a semiconductor material. The arrangement further includes at least one inactive vertical fin adjacent to at least one of the plurality of active vertical fins, wherein the at least one inactive vertical fin is at least partially made of an insulating material. The arrangement further includes a dielectric layer on at least a portion of the plurality of active vertical fins.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
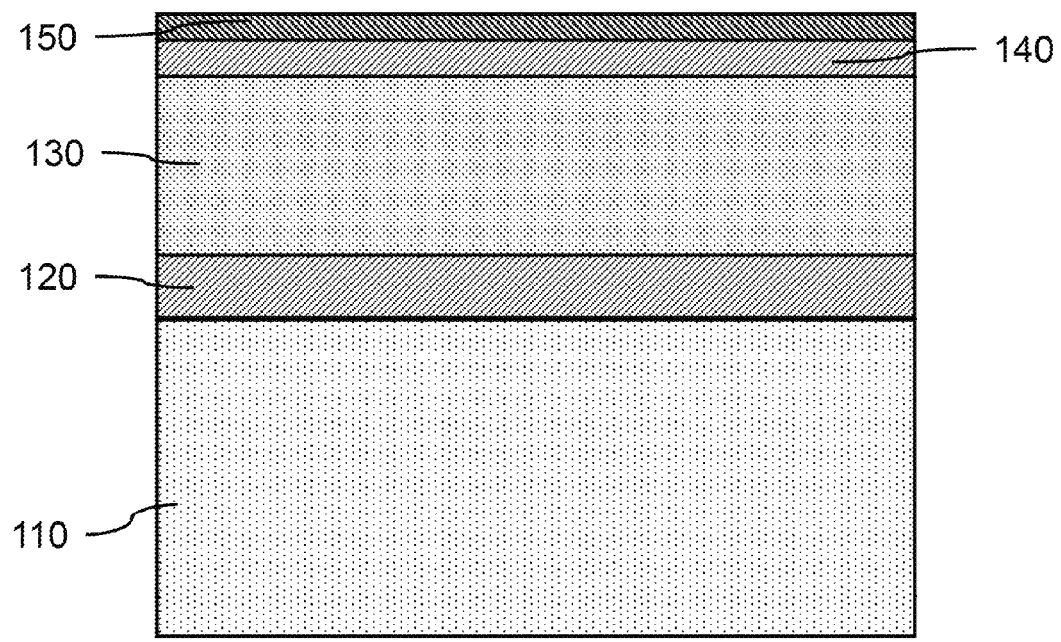
FIG. 1 is a cross-sectional side view of a fin template layer formed on the surface of a substrate, a mandrel layer formed on the fin template layer, a mandrel template layer formed on the mandrel layer, and a mandrel mask layer formed on the mandrel template layer, in accordance with the present principles.

Principles and embodiments of the present disclosure relate generally to formation of inactive (i.e., dummy) fins between active fins without utilizing a fin-cut process. Instead of physically removing one or more fins amidst an array of fins intended to form active devices, predetermined fins may be converted into inactive fins. The vertical fins may be converted into inactive vertical fins by an oxidation process, where the inactive fins physically remain in their position within the fin array, but are no longer electrically functional (e.g., conductive). Conversion of at least a portion of a semiconductor vertical fin to a non-conductive semiconductor-oxide vertical fin may render the converted vertical fin inactive (i.e., unable to function as a channel in a finFET). Due to conversion of a conductive vertical fin to a non-conductive vertical fin, a current may not pass through the vertical fin horizontally (i.e., laterally) or vertically (i.e., perpendicular to the substrate).

Principles and embodiments of the present disclosure also relate generally to selectively converting one or more vertical fins on a substrate from an active nature to an inactive nature by isolating the vertical fins and accessing preselected vertical fins for conversion from a semiconductor material to an insulating material. The vertical fin may be converted from a semiconductor material to an insulating material by a thermal reaction, for example, silicon (Si) or silicon-germanium (SiGe) may be converted into a silicon oxide by thermal reaction with an oxide-forming gas.

Principles and embodiments of the present disclosure also relate generally to an arrangement of active vertical fins and inactive vertical fins on a substrate, where the inactive vertical fin is separated from the adjacent active vertical fins by the same fin pitch as each of the active vertical fins were originally separated from each other in the arrangement. The arrangement may be a row of approximately parallel vertical fins on a region of a substrate. Forming an inactive vertical fin in the arrangement may be an alternative to performing a fin-cut process to physically remove an otherwise active vertical fin from the arrangement on the substrate. The present principles and embodiments may also be an alternative to changing (e.g., increasing) the pitch between the vertical fins to compensate for critical dimension limitations of lithographic processes and lithographic mask alignment, for example, that may be used for a fin cut process.

Exemplary applications/uses to which the present principles can be applied include, but are not limited to: formation of complementary metal oxide silicon (CMOS) field effect transistors (FETs) formed by coupled finFETs, and digital gate devices (e.g., NAND, NOR, XOR, etc.).

In various embodiments, the materials and layers may be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions may be epitaxial processes, and the deposited material may be crystalline. In various embodiments, formation of a layer may be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, which is a cross-sectional side view of a fin template layer formed on the surface of a substrate, a mandrel layer formed on the fin template layer, a mandrel template layer formed on the mandrel layer, and a mandrel mask layer formed on the mandrel template layer, in accordance with the present principles.

In one or more embodiments, a substrate 110 may be a semiconductor or an insulator with an active surface semiconductor layer. The substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer. In various embodiments, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In one or more embodiments, a fin template layer 120 may be formed on at least a portion of a surface of a substrate 110.

In various embodiments, a fin template layer 120 may be a hard mask layer for masking the substrate during transfer of a vertical fin pattern to the substrate 110. The fin template layer 120 may be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), a titanium nitride (TiN) or combinations thereof, where the fin template layer 120 may include one or more layers. The fin template layer 120 may also act as an etch-stop layer for forming sacrificial mandrels from a mandrel layer.

In various embodiments, the fin template layer 120 may be formed on the substrate surface by CVD, PECVD, PVD, thermal growth, or combinations thereof, where the fin template layer 120 may be blanket deposited on the substrate.

In one or more embodiments, a mandrel layer 130 may be formed on at least a portion of the fin template layer 120.

In various embodiments, mandrel layer 130 may be a sacrificial material that can be easily and selectively patterned and etched. The mandrel layer 130 may be amorphous silicon (a-Si), poly-silicon (p-Si), amorphous carbon (a-C), silicon-germanium (SiGe), or suitable combinations thereof.

In one or more embodiments, the mandrel layer 130 may be formed by CVD or PECVD, where the mandrel layer 130 may be blanket deposited on the fin template layer 120.

In one or more embodiments, a mandrel template layer 140 may be formed on the mandrel layer 130, where the mandrel template layer may be a hard mask layer.

The mandrel template layer 140 may be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), a titanium nitride (TiN) or combinations thereof, where the mandrel template layer 140 may include one or more layers.

In one or more embodiments, a mandrel mask layer 150 may be formed on the mandrel template layer 140, where the mandrel mask layer 150 may be a hard mask layer or soft mask layer for masking the mandrel template layer 140.

In one or more embodiments, the mandrel mask layer 150 may be a lithographic resist material (e.g., a photo resist material, an e-beam resist material, etc.).

In one or more embodiments, the mandrel mask layer 150 may be a positive or negative resist material, for example, Poly(methyl methacrylate) (PMMA) or SU-8, or an electron-beam cured material, for example, hydrogen silsesquioxane (HSQ).

Figure 2:
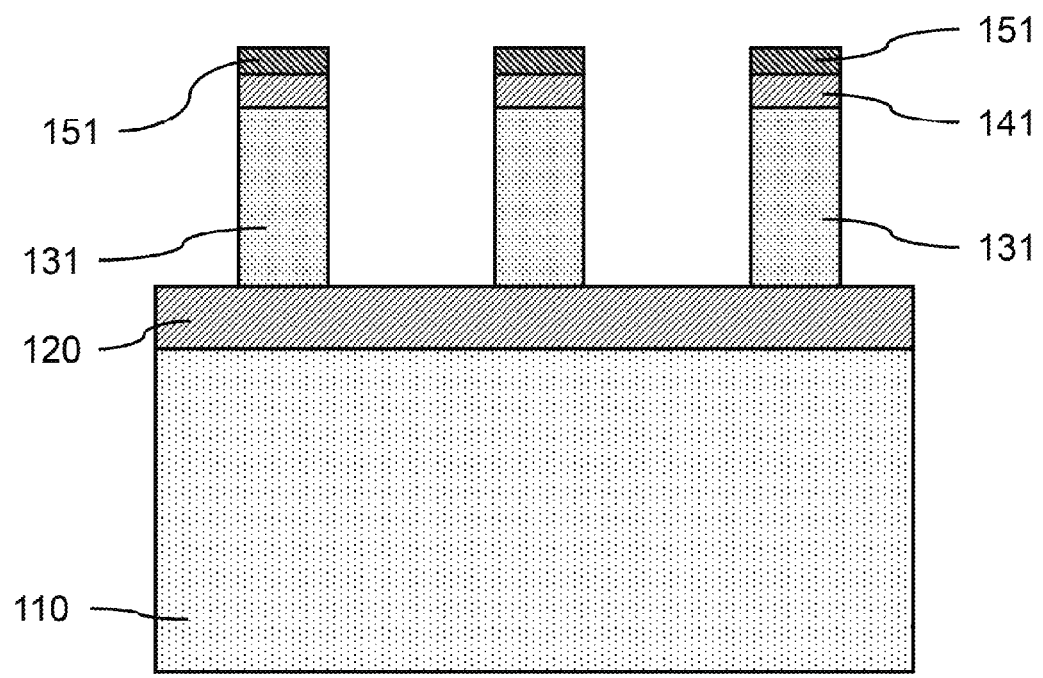
FIG. 2 is a cross-sectional side view of a mandrel mask segment and mandrel template on each of a plurality of sacrificial mandrels on a fin template layer, in accordance with the present principles.

FIG. 2 is a cross-sectional side view of a mandrel mask segment and mandrel template on each of a plurality of sacrificial mandrels on a fin template layer, in accordance with the present principles.

In various embodiments, a plurality of vertical fins may be formed by a sidewall image transfer (SIT) process, self-aligned double patterning (SADP), or self-aligned quadruple patterning (SAQP) to provide a tight pitch between vertical fins.

In one or more embodiments, the mandrel mask layer 150 may be patterned and developed to form one or more mandrel mask segments 151 on the surface of the mandrel template layer 140, where portions of the mandrel mask layer 150 may be removed to expose underlying portions of the mandrel mask layer. In various embodiments, the mandrel mask layer 150 may be lithographically patterned and developed, as would be known in the art.

In various embodiments, the one or more mandrel mask segments 151 may form a mandrel pattern on the surface of the mandrel template layer 140, where the mandrel pattern may be transferred to the mandrel template layer 140 by removing the portions of the mandrel template layer exposed by forming the mandrel mask segments 151. The mandrel pattern may be determined by the resolution of the lithography techniques (e.g., ultraviolet (UV), deep ultraviolet (DUV), e-beam, etc.) used to pattern the mandrel mask layer 150.

In one or more embodiments, the mandrel mask segments 151 may have a width in the range of about 10 nm to about 30 nm, or in the range of about 12 nm to about 20 nm, where the mandrel width may define a distance between subsequently formed adjacent vertical fins.

In various embodiments, the pitch between adjacent mandrel mask segments 151 may be in the range of about 20 nm to about 60 nm, or in the range of about 20 nm to about 40 nm, or in the range of about 25 nm to about 30 nm, which may determine the pitch between vertical fins.

In one or more embodiments, the exposed portions of the mandrel template layer 140 may be removed by wet etching or by a dry plasma etch, where the dry plasma may be a directional reactive ion etch (RIE). Removal of the exposed portions of the mandrel template layer 140 may form one or more mandrel templates 141 below the mandrel mask segments 151, and expose underlying portions of the mandrel layer 130. The mandrel templates 141 may be used to transfer the mandrel pattern to the mandrel layer 130.

In one or more embodiments, the exposed portions of the mandrel layer 130 may be removed to form one or more sacrificial mandrels 131, where the exposed portions of the mandrel layer may be removed by a direction dry plasma etch, for example, a selective RIE. The one or more sacrificial mandrels 131 may be on the fin template layer 120, where portions of the fin template layer are exposed between the sacrificial mandrel(s) 131.

Figure 3:
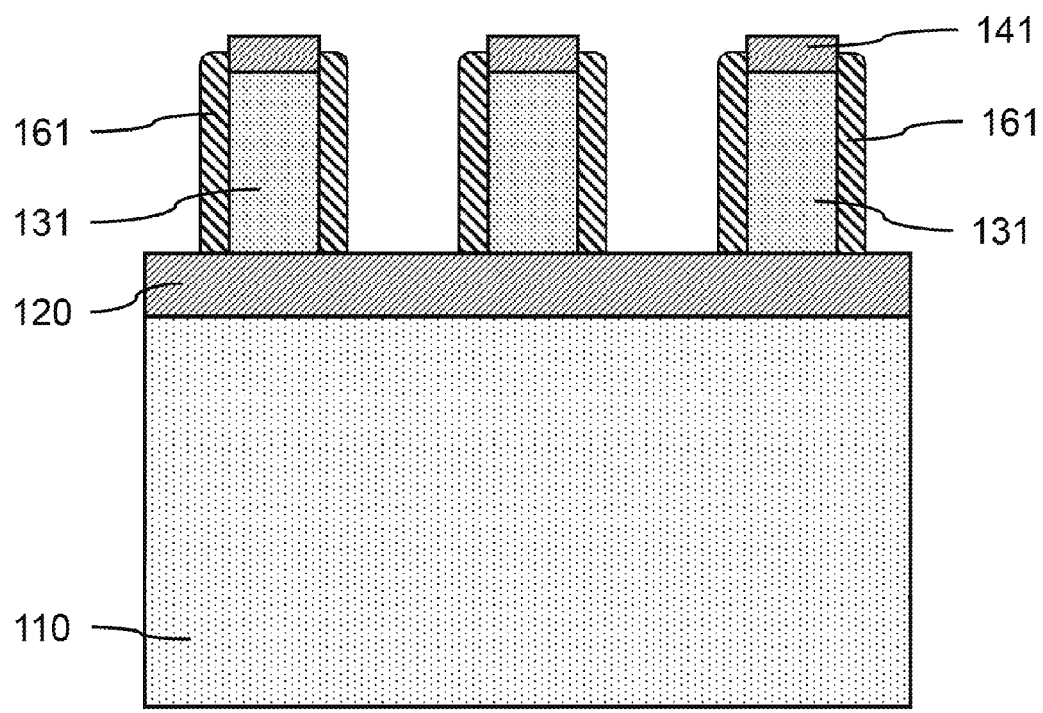
FIG. 3 is a cross-sectional side view of spacers formed on each of the sidewalls of the sacrificial mandrels, in accordance with the present principles.

FIG. 3 is a cross-sectional side view of spacers formed on each of the sidewalls of the sacrificial mandrels, in accordance with the present principles.

In one or more embodiments, spacers 161 may be formed on each of the one or more sacrificial mandrels 131, where the spacers 161 may be formed on the sidewalls.

In one or more embodiments, the spacers 161 may be formed by forming a spacer layer on the one or more sacrificial mandrels 131, where the spacer layer may be blanket deposited on each of the mandrel templates 141 on the sacrificial mandrels 131 and the exposed surfaces of the fin template layer 120. In various embodiments, the mandrel mask segments 151 may be removed from the mandrel templates 141 before formation of the spacer layer.

In various embodiments, the spacer layer may be silicon oxide (SiO), silicon nitride (SiN), silicon oxynitride (SiON), or combinations thereof.

In various embodiments, the spacer layer may be formed by ALD, PEALD, CVD, PECVD, PVD, or combinations thereof. In various embodiments, the spacer layer may be conformally deposited on the sacrificial mandrels, for example, by ALD or PEALD, to accurately control the thickness of the spacer layer on the sidewalls of the sacrificial mandrels 131.

In various embodiments, the spacer layer may have a thickness in the range of about 4 nm to about 20 nm, or in the range of about 6 nm to about 15 nm, or in the range of about 8 nm to about 12 nm, where the thickness of the spacer layer may determine the pitch and/or width of subsequently formed vertical fins.

In one or more embodiments, a portion of the spacer layer on the top surfaces of the mandrel templates 141 may be removed by a chemical-mechanical polishing (CMP) to expose the mandrel templates 141. The portion of the spacer layer on the template layer 120 may be removed by an etch-back process using a directional etch, for example, RIE may be used to remove the portion the spacer layer on surfaces approximately perpendicular to the incident ion beam, while the spacer layer on the vertical sidewalls of the sacrificial mandrels 131 remain essentially unetched.

Figure 4:
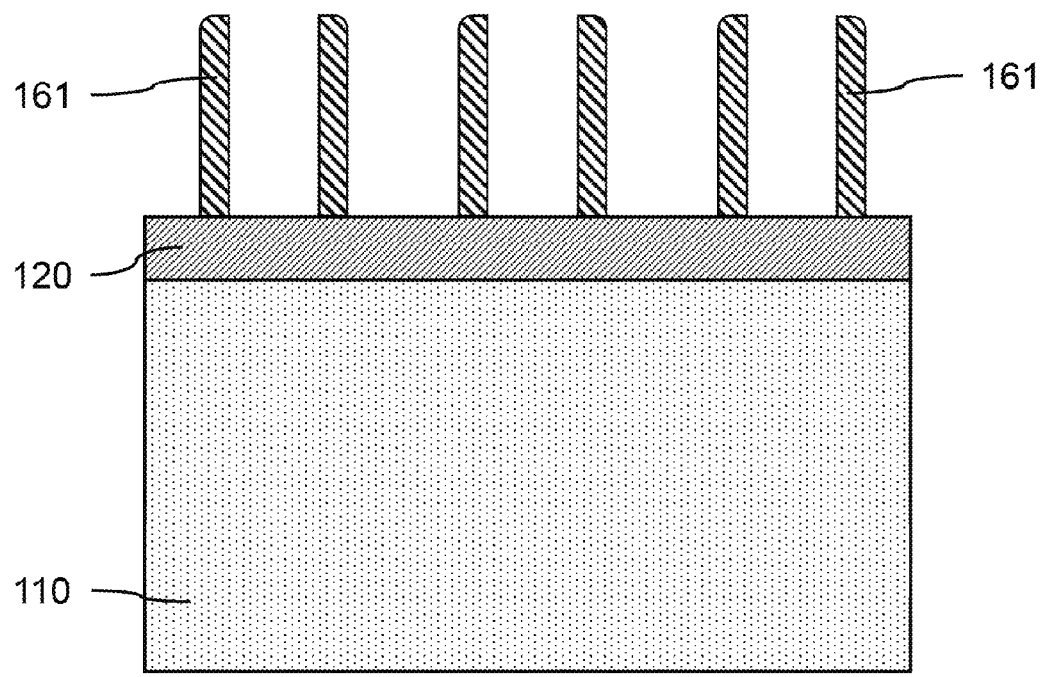
FIG. 4 is a cross-sectional side view of a plurality of spacers on a fin template layer, in accordance with the present principles.

FIG. 4 is a cross-sectional side view of a plurality of spacers on a fin template layer, in accordance with the present principles.

In one or more embodiments, the mandrel templates 141 and sacrificial mandrels 131 may be removed after the spacers are formed, where the mandrel templates 141 and sacrificial mandrels 131 may be removed by selective etching. The mandrel templates 141 and sacrificial mandrels 131 may be selectively removed, while the spacers 161 remain on the fin template layer 120 forming a fin pattern. The spacers 161 may be made of a different material from the mandrel templates 141 and sacrificial mandrels 131, so the mandrel templates 141 and sacrificial mandrels 131 may be selectively removed.

Figure 5:
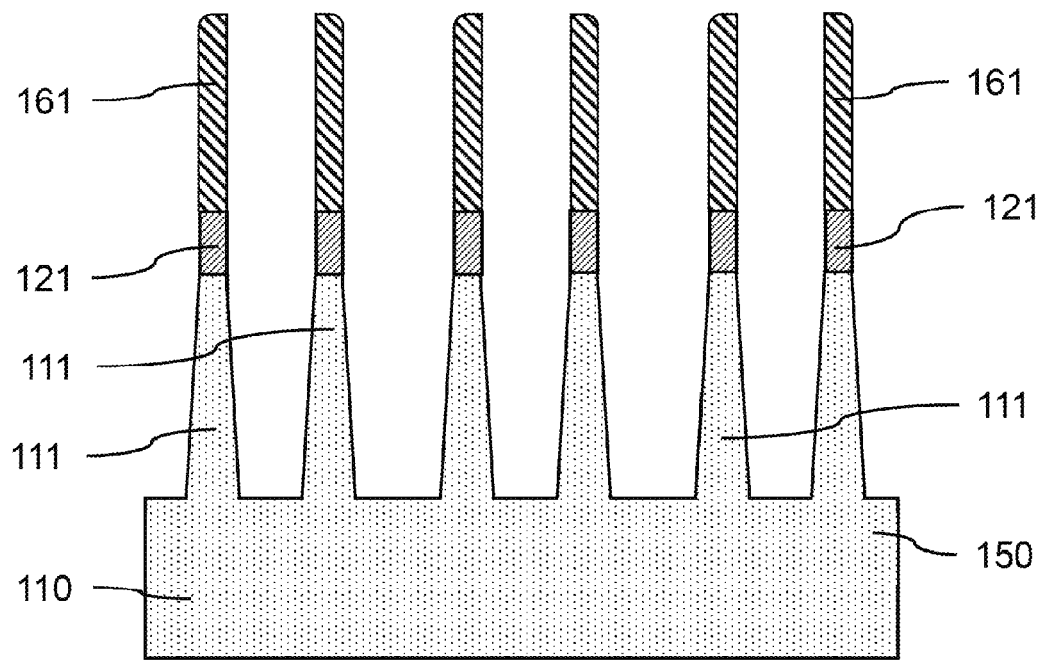
FIG. 5 is a cross-sectional side view of a spacer and fin template on each of a plurality of vertical fins formed from the substrate, in accordance with the present principles.

FIG. 5 is a cross-sectional side view of a spacer and fin template on each of a plurality of vertical fins formed from the substrate, in accordance with the present principles.

In one or more embodiments, the fin pattern formed by the spacers 161 may be transferred to the fin template layer 120 by removing the exposed portion of the fin template layer 120. In various embodiments, a portion of the fin template layer 120 may be removed to form a fin template 121 below each of the one or more spacers 161 by a direction RIE. Removal of the portions of the fin template layer 120 may expose portions of the underlying substrate 110 between the spacer(s) 161 and fin template(s) 121.

In one or more embodiments, the exposed portions of the substrate may be removed to form one or more vertical fin(s) 111, where the substrate and one or more vertical fin(s) 111 may be made of a semiconductor material. In various embodiments, the trenches may be etched into the substrate 110 between the spacer(s) 161 and fin template(s) 121 to leave free-standing vertical fin(s) 111, where the substrate may be etched by a directional RIE. The removal of the substrate material may form vertical fin(s) 111 with a tapered profile having a greater width at the base of the vertical fin(s) and a narrower width at the top of the fin(s), where the tapered profile may be produced as an aspect of the etching process. In various embodiments, the vertical fin(s) 111 may have a vertical profile with minimal or no tapering.

In non-limiting embodiments, the substrate 110 may be a single crystal silicon wafer or a single crystal silicon-germanium wafer, or the substrate may include a single crystal silicon or single crystal silicon germanium active layer at the surface of the substrate 110 from which a plurality of vertical fins may be formed.

Figure 6:
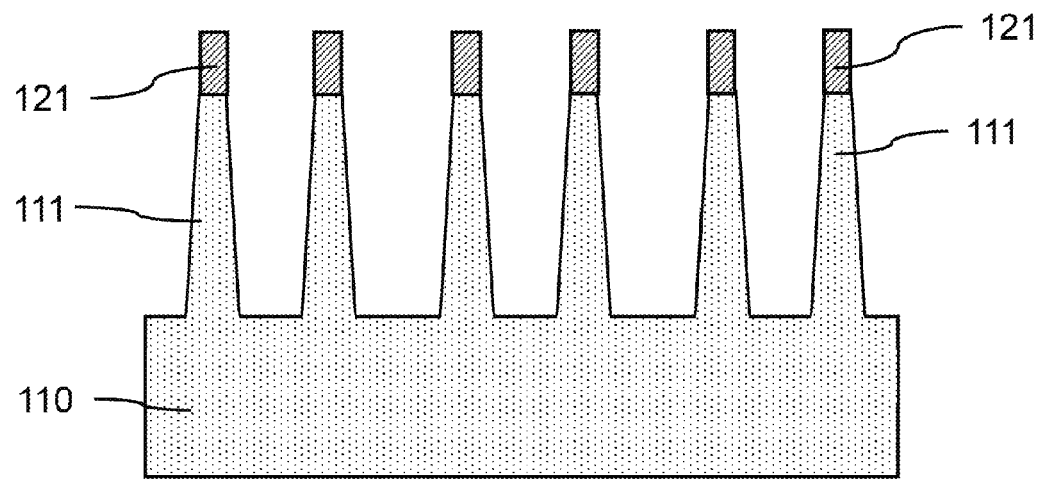
FIG. 6 is a cross-sectional side view of a plurality of vertical fins on a region of the substrate, in accordance with the present principles.

FIG. 6 is a cross-sectional side view of a plurality of vertical fins on a region of the substrate, in accordance with the present principles.

In one or more embodiments, the spacer(s) 161 and fin template(s) 121 may be removed from the top surface of the one or more vertical fin(s) 111. The spacer(s) 161 may be removed, for example, by an isotropic dry etch, a selective RIE process, or a selective wet etch. The underlying fin template(s) 121 may act as an etch stop. The exposed fin template(s) 121 may then be removed by a separate selective RIE or wet etch to expose the underlying vertical fin(s) 111. In various embodiments, the fin template(s) 121 may remain on the vertical fin(s) 111 after the spacer(s) 161 are removed.

Figure 7:
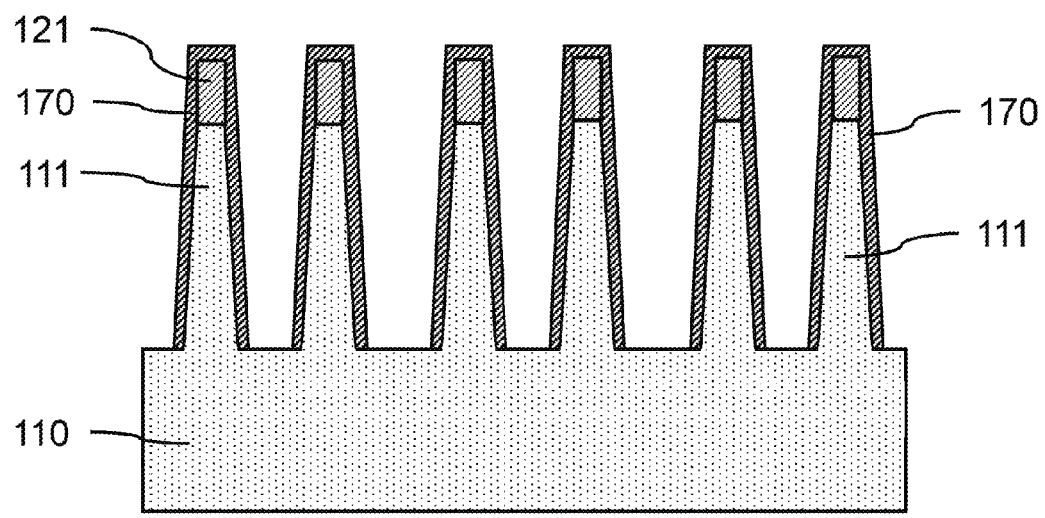
FIG. 7 is a cross-sectional side view of a protective liner on the plurality of vertical fins on the substrate, in accordance with the present principles.

FIG. 7 is a cross-sectional side view of a protective liner on the plurality of fin templates and vertical fins on the substrate, in accordance with the present principles.

In one or more embodiments, a protective liner 170 may be formed on the fin template(s) 121 and/or vertical fin(s) 111, where the protective liner 170 may cover the fin template(s) 121 and/or top surface, endwalls, and sidewalls of one or more vertical fin(s) 111. In various embodiments, the protective liner 170 may be conformally deposited on the fin template(s) 121 and/or vertical fin(s) 111, for example, by ALD, PEALD, CVD, PECVD, or a combination thereof. In various embodiments, the protective liner 170 may be formed on the vertical fin(s) 111 by oxidizing or nitriding at least an outer layer of the material of the vertical fin(s) 111.

In one or more embodiments, the protective liner may be a silicon oxide (SiO), silicon nitride (SiN), silicon oxynitride (SiON), silicon boronitride (SiBN), or combinations thereof. In various embodiments, the protective liner 170 may be $Si_3N_4$. In various embodiments, the protective liner 170, fin template(s) 121, and vertical fin(s) 111 may be different materials, such that the fin template(s) and/or protective liner may be selectively removed from the vertical fin(s) 111.

In a non-limiting exemplary embodiment, a SiO protective liner 170 may be formed on one or more SiGe vertical fin(s) 111 by oxidizing the silicon of the SiGe fin(s). In another non-limiting exemplary embodiment, a $Si_3N_4$ protective liner 170 may be formed on one or more Si vertical fin(s) 111 by conformally depositing the $Si_3N_4$ protective layer 170 on the one or more vertical fin(s) 111 by ALD or PEALD.

In one or more embodiments, the protective liner 170 may have a thickness in the range of about 5 nm to about 10 nm.

Figure 8:
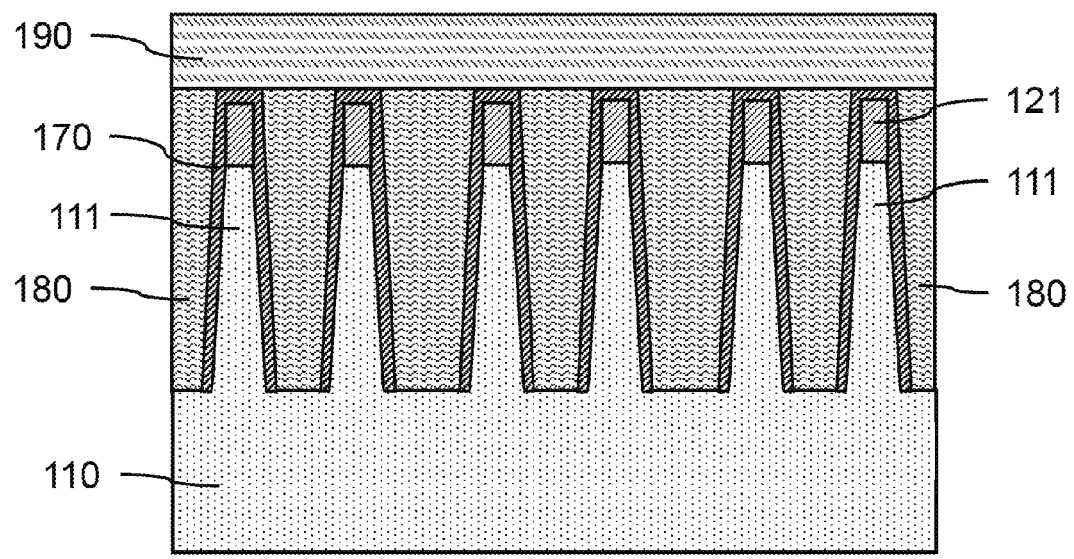
FIG. 8 is a cross-sectional side view of a filler layer filling the space between the vertical fins and a mask layer on the filler layer and fins, in accordance with the present principles.

FIG. 8 is a cross-sectional side view of a filler layer filling the space between the vertical fins and a mask layer on the filler layer and fins, in accordance with the present principles.

In one or more embodiments, a filler layer 180 may be formed on the plurality of vertical fins 111, where the filler layer may be an insulating dielectric material that fills at least the spaces between neighboring vertical fins 111. In various embodiments, the filler layer 180 may be formed on at least a portion of the protective liner 170, where the filler layer may extend above the top surface(s) of the protective liner 170. A chemical-mechanical polishing may be used to reduce the height of the filler layer 180 and provide a flat, uniform surface.

In one or more embodiments, filler layer 180 may be silicon oxide (SiO), silicon nitride (SiN), silicon oxynitride (SiON), a low-k dielectric, a high-k dielectric, or a combination thereof, although other insulating materials are also contemplated. The filler layer 180 may be a different material than the protective liner 170, so the protective liner 170 may be selectively removed from between the vertical fins 111 and filler layer.

In one or more embodiments, a masking layer 190 may be formed on at least portions of the top surface of the filler layer 180 and at least portions of the top surfaces of the protective liner 170, where the masking layer may be an organic lithography material that can be patterned and developed.

Figure 9:
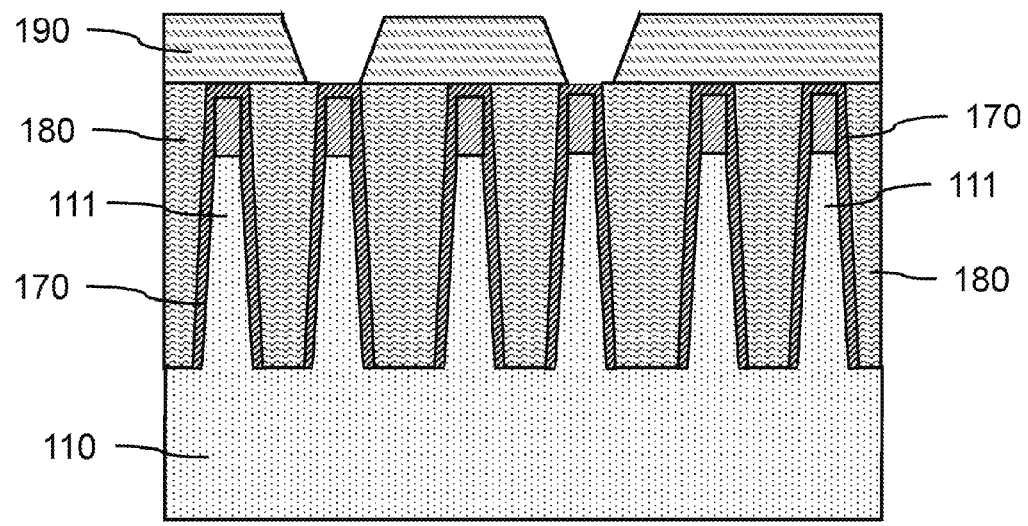
FIG. 9 is a cross-sectional side view of a patterned masking layer that exposes protective liners on one or more vertical fin(s), in accordance with the present principles.

FIG. 9 is a cross-sectional side view of a patterned masking layer that exposes protective liners on one or more vertical fin(s), in accordance with the present principles.

In one or more embodiments, the masking layer 190 may be patterned and developed to form openings that expose at least a portion of an underlying protective liner 170 on a vertical fin 111, where the vertical fin 111 may be predetermined to be converted into inactive fins. In various embodiments, portions of the protective liner 170 on a plurality of vertical fin(s) 111 may be exposed to enable conversion of a plurality of the vertical fins 111 into inactive fins. In various embodiments, a portion of the filler layer 180 may be exposed when the masking layer 190 is developed, where the opening(s) do not directly line up with the edges of the top surface of the protective liner, such that a portion of masking layer 190 may overlap with the top surface of the protective liner 170. The protective liner 170 may be only partially exposed, for example, due to lithography misalignment. One or more protective liners may remain masked by masking layer 190, such that the masked fins remain active vertical fins 111.

Figure 10:
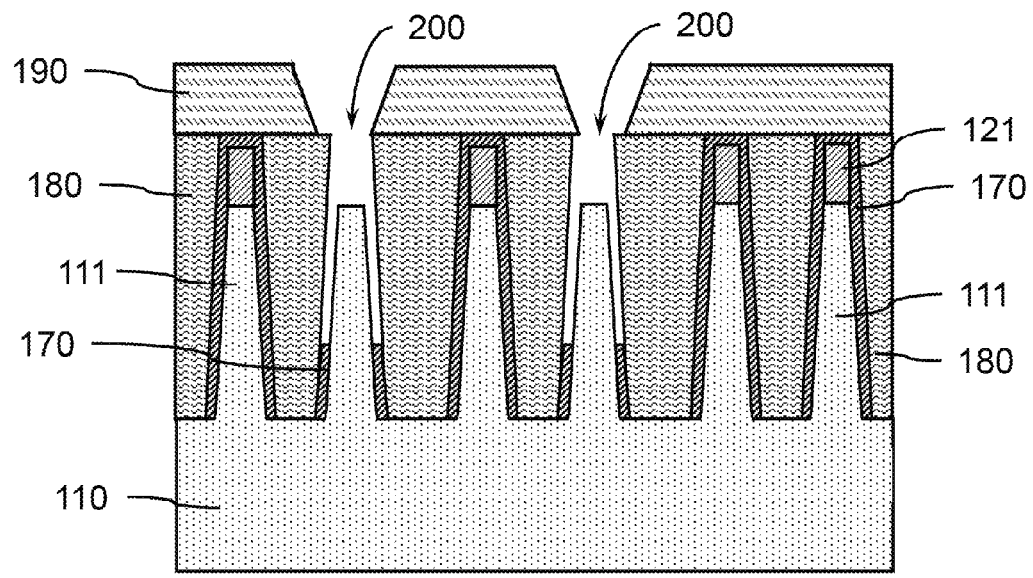
FIG. 10 is a cross-sectional side view of a partially removed protective liner on a plurality of vertical fins, in accordance with the present principles.

FIG. 10 is a cross-sectional side view of a partially removed protective liner on a plurality of vertical fins, in accordance with the present principles.

In one or more embodiments, after the protective liner 170 is exposed, at least a portion of the protective liner 170 between the vertical fin 111 and the filler layer 180 may be selectively removed. In various embodiments, a selective gaseous or wet etch may be used to selectively remove at least a portion of the protective liner 170 between the vertical fin 111 and the filler layer 180. The upper portion of the protective liner 170 may be removed leaving a lower portion of the protective liner remaining on the vertical fin 111. Portions of the protective liner 170 may be removed from one or more vertical fin(s) 111. In various embodiments, the fin template(s) 121 may be removed by the same process used to remove the protective liner 170, where the protective liner 170 and fin template(s) 121 are made of the same material.

In one or more embodiments, a silicon nitride (SiN) protective liner 170 may be at least partially removed using a hot phosphoric acid wet etchant, where the phosphoric acid etchant selectively removes the silicon nitride (SiN) protective liner 170 while leaving an oxide filler layer 180 and semiconductor vertical fin(s) 111.

In one or more embodiments, a silicon oxide (SiO) protective liner 170 may be at least partially removed using a gaseous hydrogen fluoride (HF) etchant, where the gaseous hydrogen fluoride selectively removes the silicon oxide (SiO) protective liner 170 while leaving a silicon oxynitride (SiON) or silicon boronitride (SiBN) filler layer 180 and single crystal silicon (c-Si) vertical fin(s) 111. If protective liner 170 is a silicon oxide (SiO), a different material may be used for filler layer 180, so the protective liner 170 may be selectively etched without damaging the filler layer.

In one or more embodiments, the removal of a portion or the protective liner 170 may form a reaction channel 200 from the top surface of the filler layer 180 along at least a portion of the side and/or end walls of the vertical fin 111 to allow reactants to access the surfaces of the vertical fin 111 exposed in the reaction channel 200. The reaction channel 200 may extend along the sidewalls and/or endwalls of a vertical fin 111, where the width of the reaction channel may be approximately the same as the thickness of the protective liner 170 formed on the one or more vertical fin(s) 111. The width of the reaction channel 200 may be sufficient to allow a gaseous or liquid reactant (e.g., etchant) to access the material of the vertical fin exposed at the top and along the reaction channel 200.

In various embodiments, removal of the protective liner 170 may be faster where a greater surface area of the protective liner 170 is exposed to an etchant, whereas removal of the protective liner 170 from between the vertical fin(s) 111 and the filler layer 180 may be slower due to limited diffusion of etchant and smaller exposed surface area of the protective liner 170 in a channel.

Figure 11:
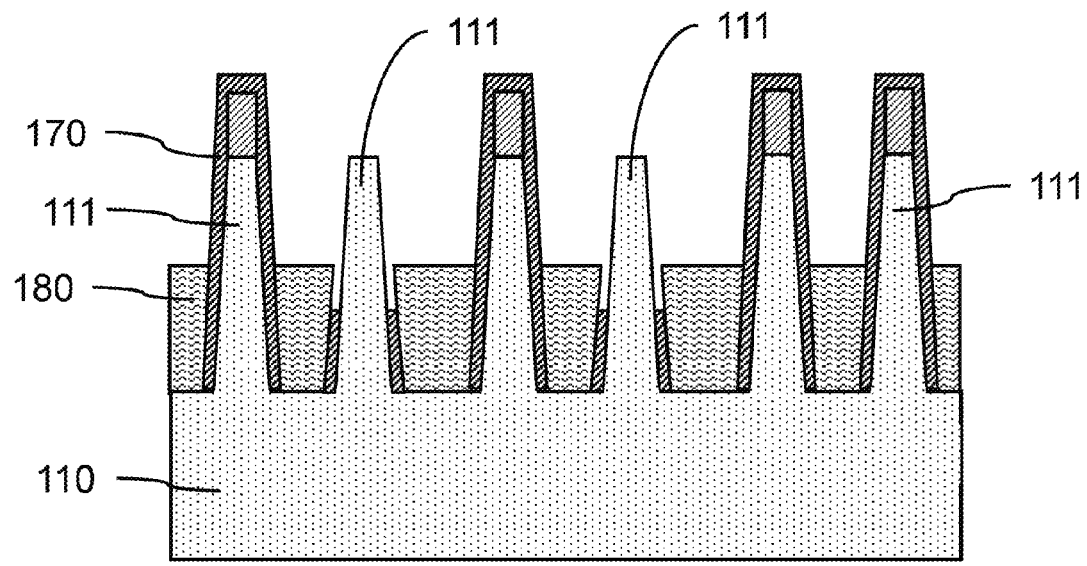
FIG. 11 is a cross-sectional side view of a reduced height filler layer exposing vertical fins covered or not covered with the protective liner, in accordance with the present principles.

FIG. 11 is a cross-sectional side view of a reduced height filler layer exposing vertical fins covered or not covered with the protective liner, in accordance with the present principles.

In one or more embodiments, the masking layer 190 may be removed, as would be known for a lithography mask, to expose the top surface of the filler layer 180.

In one or more embodiments, a portion of the filler layer 180 may be removed to reduce the height of the filler layer 180 on the vertical fin(s) 111, and protective liner.

Figure 12:
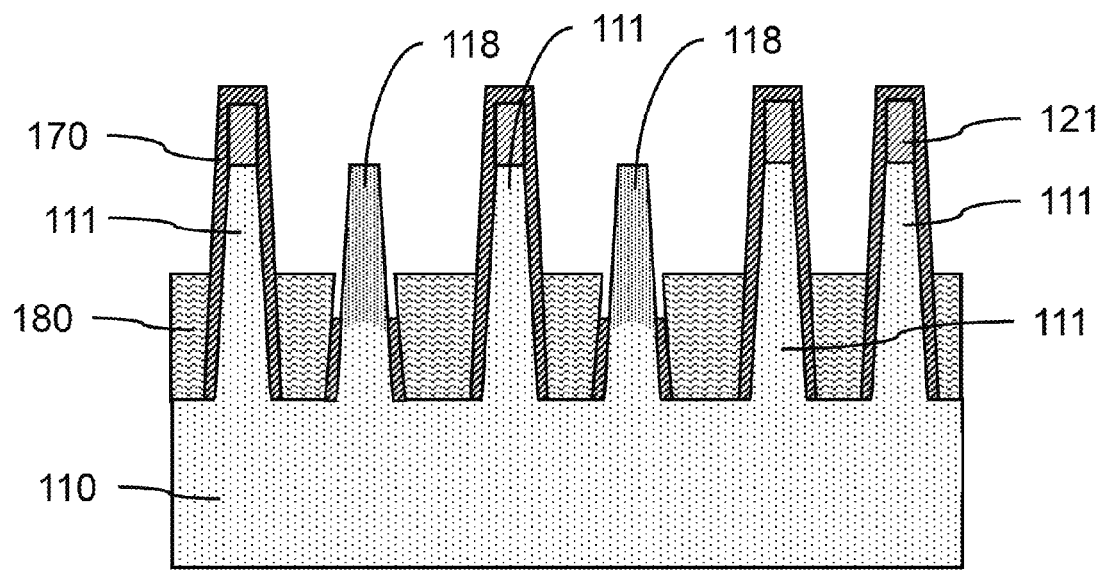
FIG. 12 is a cross-sectional side view of a plurality of vertical fins coverted to inactive fins, in accordance with the present principles.

FIG. 12 is a cross-sectional side view of a plurality of vertical fins converted to inactive fins, in accordance with the present principles.

In one or more embodiments, the vertical fins no longer completely covered by the protective liner 170 may be converted to a non-conductive material, where at least the exposed portions of the vertical fin 111 may be converted to a non-conductive material.

In one or more embodiments, the portions of the vertical fin(s) 111 not covered by the protective liner 170 may be reacted with a reactant to convert the semiconductor material of the vertical fin(s) into an insulating material. In various embodiments, the vertical fin(s) 111 may be reacted with an oxidizing and/or nitride reactant, where the oxidizing and/or nitride reactant may be a gaseous oxidizing and/or nitride reactant. In various embodiments, the reactant may be a plasma reactant that can oxidize and/or nitride the semiconducting material of the vertical fin 111.

In one or more embodiments, the exposed portion of the vertical fin(s) 111 may be thermally oxidized to form a silicon dioxide ($SiO_2$) inactive fin(s) 118, where the inactive fin(s) 118 may be adjacent to active fin(s) 111. In various embodiments, the vertical fin(s) 111 may be wet oxidized at a temperature of about 500° C. to oxidize a silicon vertical fin to silicon oxide.

In one or more embodiments, the exposed portion of the vertical fin(s) 111 may be nitrided, for example, by exposure to ammonia ($NH_3$) to form silicon nitride (e.g., $Si_3N_4$) inactive fin(s) 118, where the inactive fin(s) 118 may be adjacent to active fin(s) 111. The active vertical fin(s) 111 may be made of a semiconductor material, whereas at least a portion of the inactive vertical fin(s) may be made of an insulating material (e.g., oxide or nitride).

Figure 13:
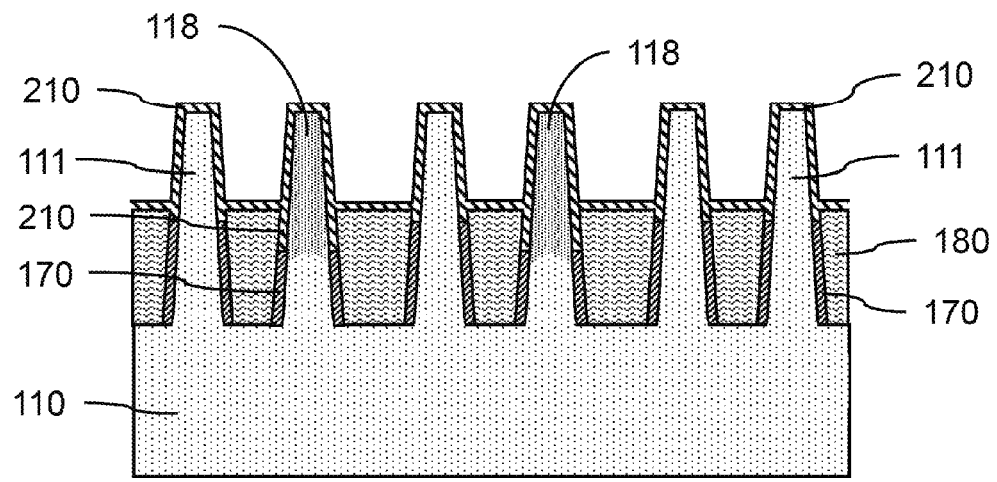
FIG. 13 is a cross-sectional side view of a gate dielectric layer formed on the active and inactive vertical fins, in accordance with the present principles.

FIG. 13 is a cross-sectional side view of a gate dielectric layer formed on the active and inactive vertical fins, in accordance with the present principles.

In one or more embodiments, remaining portion(s) of the protective liner 170 may be removed from the vertical fin(s) 111 that have not been converted to inactive fin(s) 118, where the portion(s) of the protective liner 170 exposed above the surface of the filler layer 180 may be removed. The portion(s) of the protective liner 170 may be removed by a selective etch, for example, a selective, isotropic wet or dry etch. Removal of the portion(s) of the protective liner 170 may expose the underlying active vertical fin(s) 111 above the surface of the reduced height filler layer 180. The protective liner 170 on the side(s) of an inactive fin 118 may be further recessed during removal of the protective liner 170 from the one or more active vertical fin(s) 111. The protective liner 170 may be recessed more on the inactive fin(s) 118 than the active vertical fin(s) 111, where this may be due to the repeated exposure of the protective liner 170 on the inactive fin(s) 118 to an etchant compare to a single exposure of the protective liner 170 on the active vertical fin(s) 111 to the etchant.

In a non-limiting exemplary embodiment, a silicon nitride (SiN) protective liner 170 may be removed by a hot phosphoric acid wet etch.

In one or more embodiments, a gate dielectric layer 210 may be formed on at least a portion of the exposed portions of the inactive fin(s) 118 and/or the active vertical fin(s) 111. The gate dielectric layer 210 may be part of a gate structure formed on one or more active vertical fin(s) 111, where the gate structure may extend across one or more active vertical fin(s) 111 or inactive vertical fin(s) 118. A gate structure may include a work function layer and/or a gate fill layer, where the gate fill layer and work function layer may form a conductive gate electrode.

In one or more embodiments, the gate dielectric layer 210 may be an insulating dielectric layer, for example, a silicon oxide (SiO) or a high-K dielectric.

In various embodiments, the dielectric layer 210 may be a high-K dielectric material that may include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb $(Sc_xTa_{1-x})O_3$), and lead zinc niobate (e.g., $PbZn_{1/3}Nb_{2/3}O_3$). The high-k material may further include dopants such as lanthanum and/or aluminum. The stoichiometry of the high-K compounds may vary.

In one or more embodiments, the gate dielectric layer 210 may be formed by a conformal deposition, for example, ALD, PEALD, CVD, PECVD, or combinations thereof.

Figure 14:
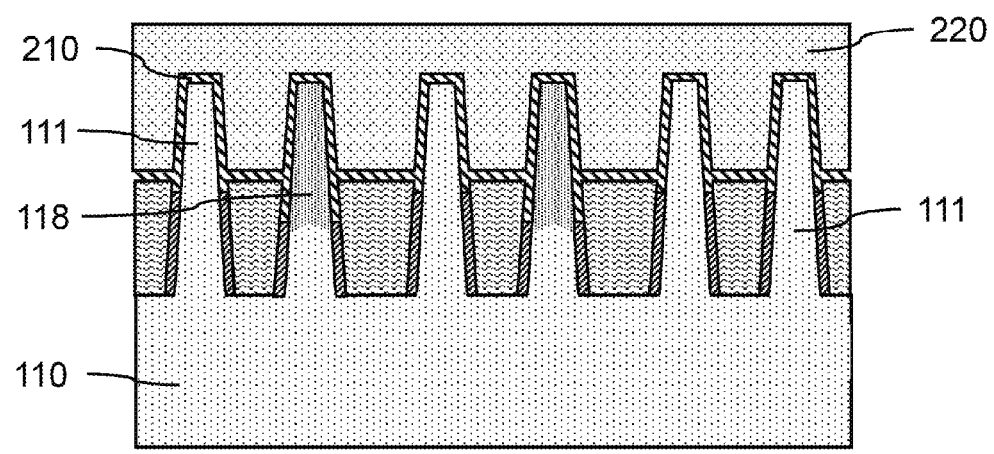
FIG. 14 is a cross-sectional side view of a dummy gate layer formed on the active and inactive vertical fins, in accordance with the present principles.

FIG. 14 is a cross-sectional side view of a dummy gate layer formed on the active and inactive vertical fins, in accordance with the present principles.

In one or more embodiments, a dummy gate layer 220 may be formed on the gate dielectric layer 210, where the dummy gate layer 220 and the gate dielectric layer 210 may be different materials. In various embodiments, the dummy gate layer 220 may be an amorphous silicon (a-Si) blanket deposited on at least a portion of the gate dielectric layer 210 and vertical fins 111, 118, where the dummy gate layer 220 may fill in the spaces between adjacent vertical fins.

Figure 15:
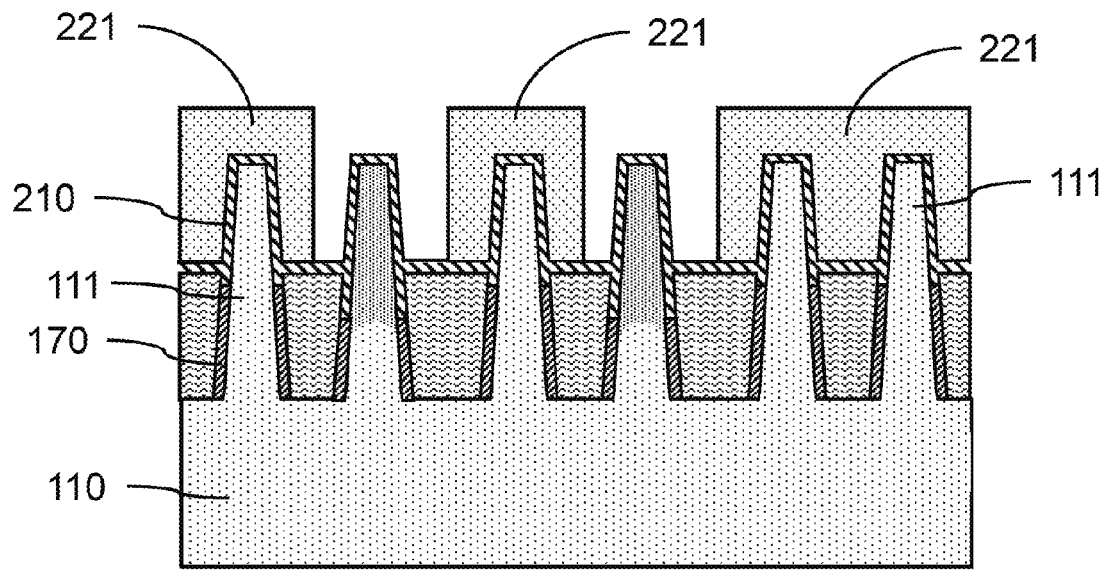
FIG. 15 is a cross-sectional side view of patterned dummy gates and exposed inactive vertical fins, in accordance with the present principles.

FIG. 15 is a cross-sectional side view of patterned dummy gates and exposed inactive vertical fins, in accordance with the present principles.

In one or more embodiments, a lithographic mask may be formed and patterned on the dummy gate layer 220, where portions of the underlying dummy gate layer 220 may be exposed through openings in the lithographic mask. The exposed portion(s) of the dummy gate layer 220 may be removed to form one or more dummy gate(s) 221, and expose at least a portion of the underlying gate dielectric layer 210. The one or more dummy gate(s) 221 may be formed on one or more active vertical fin(s) 111 and subsequently replaced by gate structures.

In one or more embodiments, portion(s) of the dummy gate layer 220 may be removed by a directional dry plasma etch, for example, an RIE.

Figure 16:
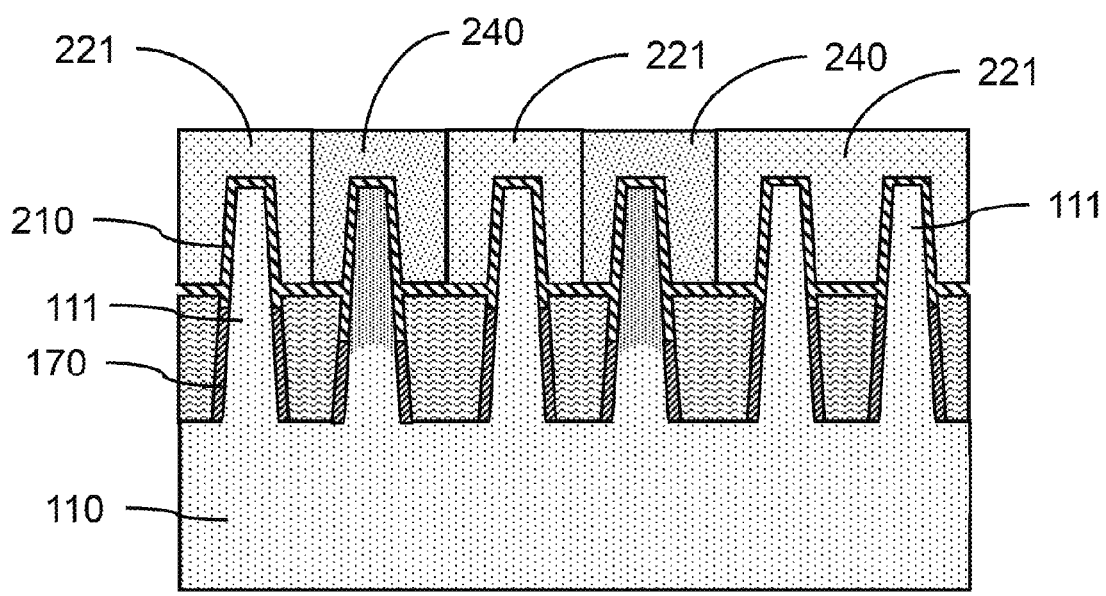
FIG. 16 is a cross-sectional side view of dummy gates and an interlayer dielectric formed on portions of the gate dielectric layer, in accordance with the present principles

FIG. 16 is a cross-sectional side view of dummy gates and an interlayer dielectric formed on portions of the gate dielectric layer, in accordance with the present principles.

In one or more embodiments, an interlayer dielectric (ILD) 240 may be formed on the exposed gate dielectric layer 210, where the interlayer dielectric 240 and the gate dielectric layer 210 may be different materials. The interlayer dielectric 220 may extend above the top surfaces of the active vertical fin(s) 111, inactive fin(s) 118, gate dielectric layer 210, and dummy gate(s) 221, where the interlayer dielectric 240 may cover the underlying active vertical fin(s) 111, inactive fin(s) 118, and gate dielectric layer 210. The interlayer dielectric 240 may fill the spaces between adjacent vertical fin(s) 111, inactive fin(s) 118, and/or dummy gates 221 to electrically isolate subsequently formed gate structures. A chemical-mechanical polishing (CMP) may be used to reduce the height of the interlayer dielectric 240, and/or to provide a smooth, flat surface to the interlayer dielectric.

In one or more embodiments, the interlayer dielectric 240 may be a silicon oxide (SiO) or a low-k dielectric material. In various embodiments, a low-k dielectric material may be a fluoride-doped silicon oxide (e.g., fluoride doped glass), a carbon-doped silicon oxide, a porous silicon oxide, a spin-on silicon based polymeric material (e.g., tetraethyl orthosilicatehydrogen (TEOS), silsesquioxane (HSQ) and methylsilsesquioxane (MSQ)), or combinations thereof.

In various embodiments, the interlayer dielectric 240 may be blanket deposited on the active vertical fin(s) 111, inactive fin(s) 118, and gate dielectric layer 210. In various embodiments, the interlayer dielectric 220 may be formed by CVD, LPCVD, or spun on.

Figure 17:
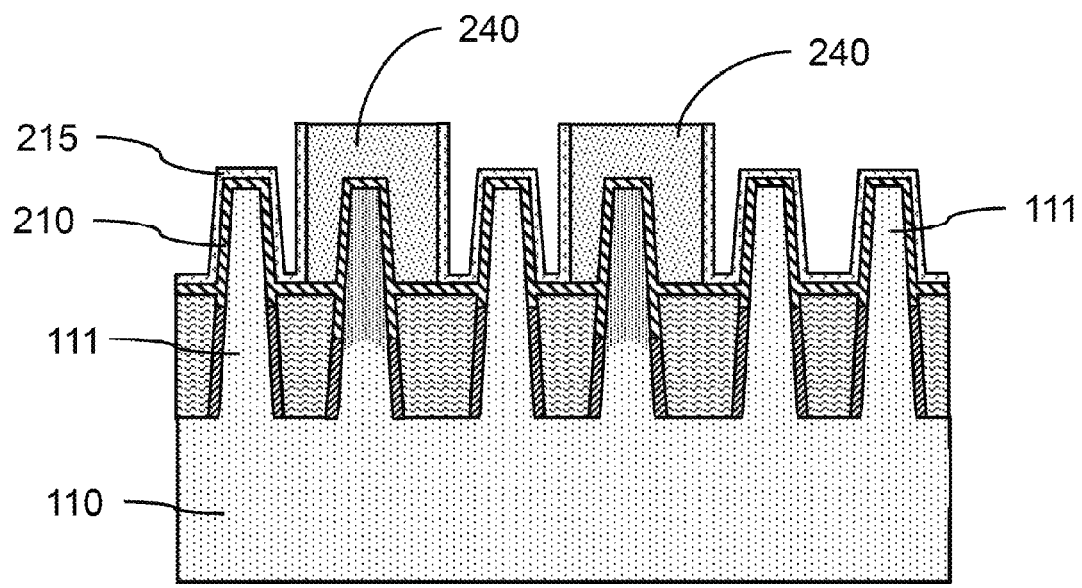
FIG. 17 is a cross-sectional side view of a work function layer and an interlayer dielectric formed on portions of the gate dielectric layer after removal of the dummy gates, in accordance with the present principles.

FIG. 17 is a cross-sectional side view of a work function layer and an interlayer dielectric formed on portions of the gate dielectric layer after removal of the dummy gates, in accordance with the present principles.

In one or more embodiments, the dummy gate(s) 221 may be removed to expose the underlying gate dielectric layer 210, where the dummy gate(s) 221 may be removed by a selective etch, for example, a selective RIE.

In one or more embodiments, a work function layer 215 may be formed on the gate dielectric layer 210 exposed by removal of the dummy gate(s) 221. A work function layer 215 may be formed on the exposed portion(s) of the gate dielectric layer 210 between interlayer dielectric 240. The work function layer 215 may be W-shaped and extend up the sidewalls of the interlayer dielectric 240. The work function layer 215 may be formed on the gate dielectric layer 210 to adjust the electrical properties of the gate electrode. In various embodiments, the work function layer 215 may be optional.

In various embodiments, a work function layer 215 may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 215 may include multiple layers of work function materials, for example, a work function layer 215 may be a TiN/TiC stack.

In one or more embodiments, the work function layer 215 may be formed by a conformal deposition, for example, ALD, PEALD, CVD, PECVD, or combinations thereof. The work function layer 215 may be formed by a directional ion deposisition, for example, PVD or a gas cluster ion beam deposition (GCIB), where the work function layer 215 may be formed on the exposed surfaces of the gate dielectric layer 210 on the active vertical fin(s) 111, but not deposited on the vertical sidewalls of the interlayer dielectric 240. Portions of the work function layer 215 may be removed from the sidewalls of the interlayer dielectric 240 by a non-directional etch. The work function layer 215 may be at least partially etched back.

In various embodiments, the work function layer 215 may have a thickness in the range of about 3 nm to about 11 nm, or may have a thickness in the range of about 5 nm to about 8 nm.

Figure 18:
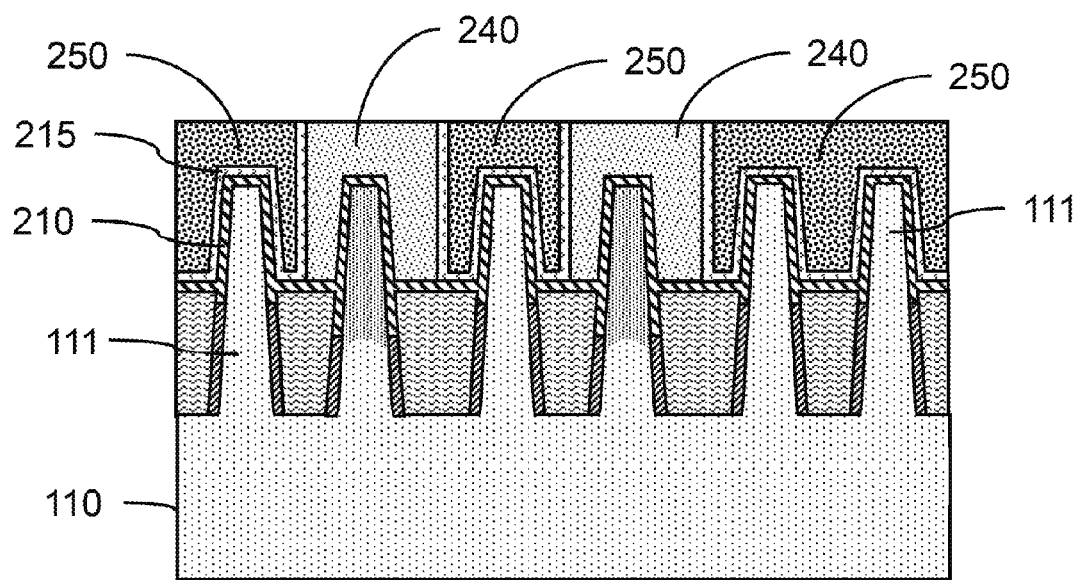
FIG. 18 is a cross-sectional side view of a work function layer and a gate fill layer formed on portions of the gate dielectric layer, in accordance with the present principles.

FIG. 18 is a cross-sectional side view of a work function layer and a gate fill layer formed on portions of the gate dielectric layer, in accordance with the present principles.

In one or more embodiments, a gate fill layer 250 may be formed on the gate dielectric layer 210 and/or work function layer 215 if present, where the gate fill layer 250 may fill in the space(s) between interlayer dielectric 240. The gate fill layer 250, gate dielectric layer 210, and optionally the work function layer 215, may form a gate structure on one or more active vertical fin(s) 111, where the gate fill layer 250 and work function layer 215 may form a conductive gate electrode.

In various embodiments, the gate fill layer 250 may be blanket deposited on the exposed surfaces of the gate dielectric layer 210 and/or work function layer 215 on the vertical fin(s) 111. The formed gate fill layer 250 may extend above the top surface of the interlayer dielectric 240, where the gate fill layer material above the top surfaces of the interlayer dielectric 240 may be removed by a CMP to provide a flat, uniform surface.

In various embodiments, the gate fill layer 250 may be a conductive metal, where the metal may be tungsten (W), titanium (Ti), molybdenum (Mo), cobalt (Co), or a conductive carbon material (e.g., carbon nanotube, graphene, etc.), or any suitable combinations thereof.

The interlayer dielectric 240 may physically and electrically separate the gate electrodes formed on the active vertical fin(s) 111.

Figure 19:
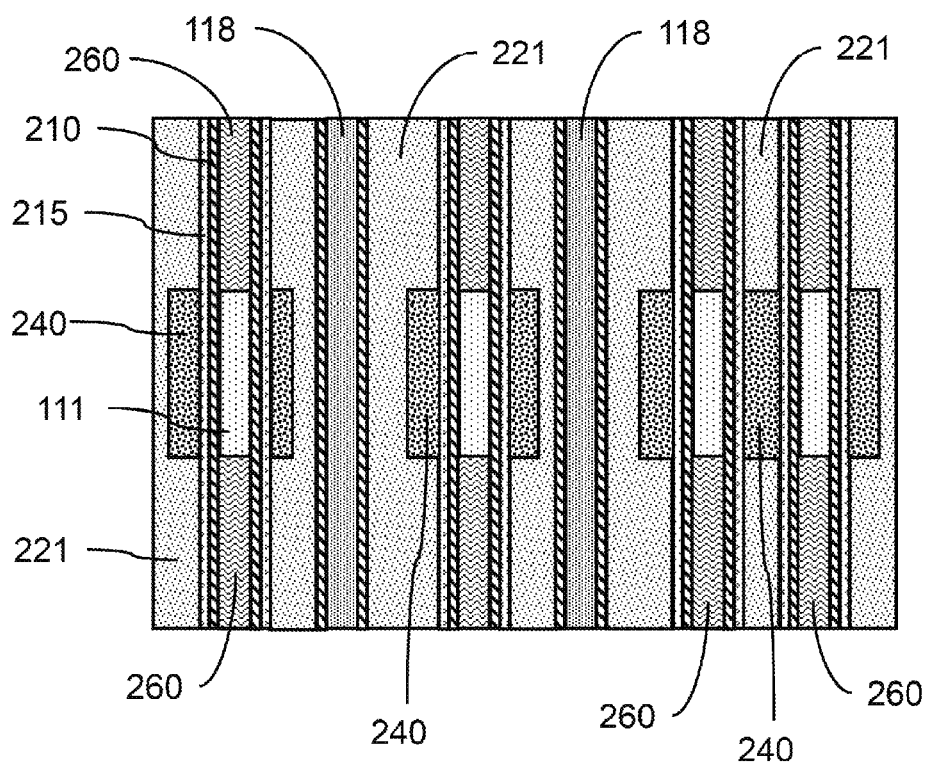
FIG. 19 is a cross-sectional top view of an arrangement of adjacent active vertical fins and inactive vertical fins having gate structures thereon, in accordance with the present principles.

FIG. 19 is a cross-sectional top view of an arrangement of adjacent active vertical fins and inactive vertical fins having gate structures thereon, in accordance with the present principles.

In one or more embodiments, a plurality of active vertical fins 111 may be arranged on a substrate with one or more inactive vertical fin(s) 118, wherein each of the one or more inactive vertical fin(s) 118 may be adjacent to at least one active vertical fin 111. The active vertical fins 111 may be made of a semiconductor material that may be the same material as the substrate 110. The inactive vertical fin(s) 118 may be at least partially made of an insulating material, for example, silicon oxide or silicon nitride, where a portion of the semiconductor material of an active vertical fin has been converted to the insulating material.

In various embodiments, the plurality of active and inactive vertical fins may be arranged in a row, where the sidewalls (i.e., sides having the larger surface area) of the fins are facing adjacent fins. An inactive vertical fin 118 or active vertical fin 111 may be at the periphery of the arrangement, such that the active or inactive fin has only one adjacent vertical fin, which may be an active vertical fin 111 or an inactive vertical fin 118. In a non-limiting exemplary embodiment, at least three vertical fins may be arranged adjacent to each other on a substrate, where one of the three vertical fins may be an inactive vertical fin 118, and the remaining two vertical fins may be active (e.g., electrically conductive) vertical fins 111.

In one or more embodiments, the pitch between an inactive vertical fin 118 and an active vertical fin 111 adjacent to the inactive vertical fin 118 may be the same as the pitch between any other two adjacent vertical fins in an arrangement. The active and inactive vertical fins may be in the same row, such that there is the same distance between each adjacent vertical fin in the row. In various embodiments, the pitch between adjacent vertical fins 111, 118 may be in the range of about 20 nm to about 60 nm, or in the range of about 20 nm to about 40 nm, or in the range of about 25 nm to about 30 nm.

In one or more embodiments, gate fill layer 250 may extend across one or more active vertical fin(s) 111, where the gate fill layer 250 may be part of a gate structure on a central portion of the active vertical fin(s) 111. The size and position of the gate structure on the top surface and sidewalls along the length of the vertical fin(s) 111 may define the position and size of a channel for the formation of a fin field effect transistor (finFET). Source/drains 260 may be formed on opposite ends of the active vertical fin(s) to fabricate a finFET having current flow laterally through the fin (i.e., parallel to the plane of the substrate). A finFET may have multiple source/drains and gate structures coupled together to form a multi-fin FET, where a source/drain may extend across multiple adjacent vertical fins 111.

In various embodiments, source/drain(s) 260 may be formed by doping opposite ends of the active vertical fin(s) 111, where the source/drains are on opposite sides of the gate structure and channel of the finFET. In various embodiments, source/drain(s) may be formed by epitaxial growth of a compatible semiconductor material on opposite ends of the one or more active vertical fin(s) 111, where the source/drain(s) may be doped in-situ (during epitaxial growth) or ex-situ, for example, through ion implantation. Additional processes may then be used to finish fabrication of the finFET, including formation of electrical contacts, as would be known in the art.

In various embodiments, the source/drain(s) may be doped in-situ, for example, during epitaxial growth of an active semiconductor layer on a crystalline surface of the vertical fin(s) 111 and/or substrate 110, or ex-situ, for example, through ion implantation or thermal diffusion of dopants into the vertical fin(s) 111 and/or substrate. The dopant of the source/drains may be activated by annealing. Other suitable doping techniques may also be used, including but not limited to, gas phase doping, plasma doping, plasma immersion ion implantation, cluster doping, infusion doping, liquid phase doping, solid phase doping, or combinations thereof.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An arrangement of active and inactive fins on a substrate, comprising:
   a plurality of active vertical fins, wherein the active vertical fins are made of a semiconductor material;
   at least one inactive vertical fin adjacent to at least one of the plurality of active vertical fins, wherein the at least one inactive vertical fin is at least partially made of an insulating material; and
   a dielectric layer on at least a portion of the plurality of active vertical fins.

2. The arrangement of active and inactive fins of claim 1, wherein at least two of the plurality of active vertical fins are adjacent to each other, and the pitch between the at least one inactive vertical fin and the at least one of the plurality of active vertical fins adjacent to the at least one inactive vertical fin is the same as the pitch between the two adjacent active vertical fins.

3. The arrangement of active and inactive fins of claim 1, further comprising a gate fill layer on at least a portion of the dielectric layer to form a gate structure on at least one of the plurality of active vertical fins.

4. The arrangement of active and inactive fins of claim 3, further comprising a source/drain at opposite ends of the plurality of active vertical fins.

5. The arrangement of active and inactive fins of claim 1, further comprising a protective liner on at least a portion of each of the plurality of active vertical fins and on at least a portion of the at least one inactive vertical fin.

6. The arrangement of active and inactive fins of claim 5, wherein the protective liner is silicon oxide (SiO), silicon nitride (SiN), silicon oxynitride (SiON), silicon boronitride (SiBN), or combinations thereof.

7. The arrangement of active and inactive fins of claim 6, wherein the protective liner is silicon nitride.

8. The arrangement of active and inactive fins of claim 1, wherein the at least one inactive vertical fin is between two of the plurality of active vertical fins.

9. The arrangement of active and inactive fins of claim 8, wherein the at least one inactive vertical fin is partially made of a semiconductor oxide.

10. An arrangement of active and inactive fins on a substrate, comprising:
a plurality of active vertical fins, wherein the active vertical fins are made of a semiconductor material;
at least one inactive vertical fin adjacent to at least one of the plurality of active vertical fins, wherein the at least one inactive vertical fin is at least partially made of a semiconductor oxide; and
a protective liner on at least a portion of each of the plurality of active vertical fins and on at least a portion of the at least one inactive vertical fin.

11. The arrangement of active and inactive fins of claim 10, wherein the protective liner is silicon oxide (SiO), silicon nitride (SiN), silicon oxynitride (SiON), silicon boronitride (SiBN), or combinations thereof.

12. The arrangement of active and inactive fins of claim 10, further comprising, a filler layer that fills at least a portion of the spaces between neighboring active and inactive fins.

13. The arrangement of active and inactive fins of claim 12, further comprising a dielectric layer on at least a portion of the plurality of active vertical fins and on the filler layer between neighboring active and inactive fins.

14. The arrangement of active and inactive fins of claim 12, wherein the pitch between neighboring active and inactive fins is in the range of about 20 nm to about 60 nm.

15. The arrangement of active and inactive fins of claim 12, wherein the dielectric layer is silicon oxide (SiO) or a high-K dielectric.

16. An arrangement of active and inactive fins on a substrate, comprising:
a plurality of active vertical fins, wherein the active vertical fins are made of a semiconductor material;
at least one inactive vertical fin adjacent to at least one of the plurality of active vertical fins, wherein the at least one inactive vertical fin is at least partially made of a semiconductor oxide;
a filler layer that fills at least a portion of the spaces between neighboring active and inactive fins;
a dielectric layer on at least a portion of the plurality of active vertical fins and on the filler layer between neighboring active and inactive fins; and
a protective liner on at least a portion of each of the plurality of active vertical fins and on at least a portion of the at least one inactive vertical fin.

17. The arrangement of active and inactive fins of claim 16, further comprising, a work function layer on at least a portion of the dielectric layer.

18. The arrangement of active and inactive fins of claim 17, further comprising, a gate fill layer on at least a portion of the work function layer to form a gate structure on at least one of the plurality of active vertical fins.

19. The arrangement of active and inactive fins of claim 18, wherein the at least one inactive vertical fin is partially made of a semiconductor oxide.

20. The arrangement of active and inactive fins of claim 18, wherein the pitch between neighboring active and inactive fins is in the range of about 20 nm to about 60 nm.

* * * * *